US011046092B2

(12) United States Patent
Roshelli et al.

(10) Patent No.: US 11,046,092 B2
(45) Date of Patent: Jun. 29, 2021

(54) PHOTOPOLYMER FILM WITH UV FILTERING

(71) Applicant: MacDermid Graphics Solutions LLC, Waterbury, CT (US)

(72) Inventors: Albert G. Roshelli, Smyrna, GA (US); Nigel Heywood, Atlanta, GA (US)

(73) Assignee: MacDermid Graphics Solutions LLC, Waterbury, CT (US)

( * ) Notice: Subject to any disclaimer, the term of this patent is extended or adjusted under 35 U.S.C. 154(b) by 0 days.

(21) Appl. No.: 16/274,920

(22) Filed: Feb. 13, 2019

(65) Prior Publication Data

US 2020/0254786 A1    Aug. 13, 2020

(51) Int. Cl.
*B41J 11/00*     (2006.01)

(52) U.S. Cl.
CPC .................. *B41J 11/0015* (2013.01)

(58) Field of Classification Search
CPC ............... B41J 11/00; B41J 11/0015
See application file for complete search history.

(56) References Cited

U.S. PATENT DOCUMENTS

| | | |
|---|---|---|
| 3,265,765 A | 8/1966 | Holden et al. |
| 3,597,080 A | 8/1971 | Gush et al. |
| 3,867,153 A | 2/1975 | MacLachlan |
| 4,229,520 A | 10/1980 | Bratt et al. |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 4,622,088 A | 11/1986 | Min |
| 5,135,827 A | 8/1992 | Bohm et al. |
| 5,213,949 A | 5/1993 | Kojima et al. |
| 5,223,375 A | 6/1993 | Berrier et al. |
| 5,813,342 A | 9/1998 | Strong |
| 5,976,765 A * | 11/1999 | Kumpfmiller ........ G03F 7/0955 430/15 |
| 6,063,546 A | 5/2000 | Gelbart |
| 8,158,331 B2 | 4/2012 | Recchia |
| 2008/0107908 A1 | 5/2008 | Long et al. |
| 2012/0082932 A1 | 4/2012 | Battisti et al. |
| 2014/0080042 A1 | 3/2014 | Maneira |
| 2015/0097889 A1 * | 4/2015 | Maneira ................. B41J 11/002 347/16 |
| 2015/0125796 A1 * | 5/2015 | Karp ........................ G03F 7/20 430/306 |

FOREIGN PATENT DOCUMENTS

| | | |
|---|---|---|
| EP | 0456336 | 11/1991 |
| EP | 0640878 | 3/1995 |
| GB | 1366769 | 9/1974 |

OTHER PUBLICATIONS

"Photopolymer," Widipedia 1984, retrieved from the Internet on Apr. 15, 2020 at https://en.wikipedia.org/wiki/photopolymer, paragraph 1.

* cited by examiner

*Primary Examiner* — Scott A Richmond
(74) *Attorney, Agent, or Firm* — Carmody Torrance Sandak & Hennessey LLP

(57) ABSTRACT

A method of creating an image film negative capable of masking non-image areas of one or more layers of liquid photopolymer during a step of imagewise exposing the one or more layers of liquid photopolymer to actinic radiation. The method includes the steps of (a) providing an image film negative comprising a negative of an image on the image film negative, wherein the negative of the image comprises a pattern of opaque areas; and (b) inkjet printing a filtering layer on portions of the image film negative not covered by the pattern of opaque areas, wherein the portions of the image film negative comprise portions where it is desirable to modulate intensity of actinic radiation in a subsequent exposure step.

14 Claims, No Drawings

PHOTOPOLYMER FILM WITH UV FILTERING

FIELD OF THE INVENTION

The present invention relates generally to a method of improving the copy or tone range of photopolymer printing elements, especially photopolymer printing elements made from liquid photopolymers.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography.

Photosensitive printing elements generally comprise a support layer, one or more photosensitive layers, an optional slip film release layer, and an optional protective cover sheet. The protective cover sheet is formed from plastic or any other removable material that can protect the plate or photocurable element from damage until it is ready for use. If used, the slip film release layer is typically disposed between the protective cover sheet and the photocurable layer(s) to protect the plate from contamination, increase ease of handling, and act as an ink-accepting layer. After exposure and development, the photopolymer flexographic printing plate consists of various image elements supported by a floor layer and anchored to a backing substrate.

It is highly desirable that flexographic printing plates work well under a wide range of conditions. For example, the printing plates should be able to impart their relief image to a wide range of substrates, including cardboard, coated paper, newspaper, calendared paper, and polymeric films such as polypropylene. Importantly, the image should be transferred quickly and with fidelity, for as many prints as the printer desires to make.

The demands placed on flexographic printing plates are considerable. For example, a flexographic printing plate must have sufficient flexibility to wrap around a printing cylinder yet be strong enough to withstand the rigors experienced during a typical printing process. The printing plate should exhibit a low hardness to facilitate ink transfer during printing. It is also important that the surface of the printing plate be dimensionally stable during storage. In addition, the printing plate must also have a relief image that has a chemical resistance against the aqueous-based or alcohol-based inks that are typically used in flexographic printing. Finally, it is also highly desirable that the physical and printing properties of the printing element are stable and do not change during printing.

Flexographic printing elements can be manufactured in various ways including with sheet polymers and by the processing of liquid photopolymer resins.

Sheet polymer printing plate production is described, for example, in U.S. Pat. No. 8,158,331 to Recchia, the subject matter of which is herein incorporated by reference in its entirety. Photocurable materials typically comprise an elastomeric compound, an ethylenically unsaturated compound having at least one terminal ethylene group, and a photoinitiator, examples of which are described in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may also be used.

Flexographic printing elements made from liquid photopolymer resins have an advantage over sheet polymers in that uncured resin can be reclaimed from the non-image areas of the printing elements and used to make additional printing plates. Liquid photopolymer resins have a further advantage as compared to sheet polymer in terms of flexibility, which enables the production of any required plate gauge simply by changing the machine settings.

Various processes have been developed for producing printing plates from liquid photopolymer resins as described, for example, in U.S. Pat. Pub. No. 2012/0082932 to Battisti et al., U.S. Pat. Pub. No. 2014/0080042 to Maneira, U.S. Pat. No. 5,213,949 to Kojima et al., U.S. Pat. No. 5,813,342 to Strong et al., U.S. Pat. Pub. No. 2008/0107908 to Long et al., and in U.S. Pat. No. 3,597,080 to Gush, the subject matter of each of which is herein incorporated by reference in its entirety.

Typical steps in the liquid platemaking process include:
(1) casting and exposure;
(2) reclamation;
(3) washout;
(4) post exposure;
(5) drying; and
(6) detackification.

In the casting and exposure step, a negative of the desired relief image is placed on a bottom glass platen and a coverfilm is placed over the negative in an exposure unit. The exposure unit generally comprises the bottom glass platen with one or more sources of UV light below it (lower lights) and lid having flat top glass platen with one or more sources of UV light above it (upper lights).

All of the air is removed by vacuum so that any wrinkling of the negative or coverfilm can be eliminated. In addition, the bottom glass platen may be grooved to further remove any air between the coverfilm and the negative. Thereafter, one or more layers of liquid photopolymer and a backing sheet (i.e., a thin layer of polyester or polyethylene terephthalate) are cast on top of the coverfilm and negative to a predetermined thickness. A backing sheet, which may be coated on one side to bond with the liquid photopolymer, is laminated over the cast liquid photopolymer layer to serve as the back of the plate after exposure.

The upper and lower lights are used to expose the photopolymer to actinic radiation to selectively crosslink and cure the liquid photopolymer layer in the areas not covered by the negative. The upper lights are used to create the floor layer of the printing plate which sets the depth of relief (i.e., back exposure) while the lower lights are used to face expose the photopolymer to actinic radiation through the negative to create the relief image. Plate gauge may be set by positioning a top exposure glass at a desired distance from a bottom exposure glass after dispensing liquid photopolymer on the protected bottom exposure glass.

The upper lights are turned on for a prescribed amount of time to cause the photopolymer adjacent to the substrate to crosslink uniformly over the entire surface of the plate, forming the floor layer. Thereafter, areas to be imaged are exposed to actinic radiation from the lower lights (i.e., through the bottom glass platen). The actinic radiation shines through transparent areas of the negative, which causes the photopolymer to crosslink in those areas, forming the relief image that bonds to the floor layer. The liquid photopolymer that is not exposed to the lower light source (i.e., the uncured photopolymer) remains in a liquid state and can be reclaimed and reused.

After the exposure is complete, the printing plate is removed from the exposure unit. In all areas not exposed to actinic radiation, the resin remains liquid after exposure and can be reclaimed. This "reclamation" step may involve squeegeeing, vacuuming or otherwise removing liquid photopolymer remaining on the surface of the printing plate, which not only saves material costs of the photopolymer resin, but also reduces the use and cost of developing chemistry and makes a lighter plate that is safer and easier to handle.

Any residual traces of liquid resin remaining after the reclamation step may be removed by nozzle washing or brush washing using a wash-out solution to obtain a washed-out plate, leaving behind the cured relief image. Typically, the plate is placed into a washout unit where an aqueous solution comprising soap and/or detergent is used to wash away any residual unexposed photopolymer. After development, a relief image formed of cured photopolymerized resin is obtained. The cured resin is likewise insoluble in certain inks and is usable in flexographic printing.

After the washout step has been completed, the printing plate may be subjected to various post exposure and detackification steps. For example, post exposure may involve submerging the plate in a water and salt solution and performing an additional exposure of the printing plate to actinic radiation (UV light) to fully cure the printing plate and to increase plate strength. The printing plate may then be rinsed and dried by blowing hot air onto the plate, by using an infrared heater or by placing the printing plate into a post exposure oven.

If used, the detackification step may involve the use of a germicidal unit (i.e., light finisher) to ensure a totally tack-free plate surface. This step is not required for all plates, as certain resins may be tack-free and thus printing press ready without the need for the detackification step.

Liquid photopolymer compositions are described, for example, in U.S. Pat. No. 2,760,863 to Plambeck, U.S. Pat. Nos. 3,960,572 and 4,006,024 to Ibata et al., U.S. Pat. Nos. 4,137,081, 4,174,218 and 4,442,302 to Pohl, U.S. Pat. No. 4,857,434 to Klinger, and U.S. Pat. Pub. No. 2003/0152870 to Huang, the subject matter of each of which is herein incorporated by reference in its entirety.

A solid capped liquid photopolymer printing element can also be made which comprises a backing sheet, at least one liquid photopolymer layer, a solid photocurable layer and an optional coversheet layer for protection of the photographic negative. Solid capped liquid photopolymer printing elements are described, for example, in U.S. Pat. No. 5,976,765 to Kumpfmiller et al., the subject matter of which is herein incorporated by reference in its entirety.

The images produced by the use of flexographic printing elements generally include both solid image areas and a variety of gray tone areas. By "solid areas" what is meant is that the areas are completely covered by ink having the highest density the ink can produce on a given substrate material. By "gray areas" what is meant is the image areas where the appearance of the printed image is of a density intermediate to the total absence of ink (i.e., pure white) and solid. These gray areas are produced by the process of "half-toning" in which a plurality of relief surface areas per unit area of progressively large surface area are used to produce the illusion of different print density. The halftone pattern is produced using a mask or film image negative that comprises a negative pattern of dots that are to be reproduced on the printing element.

Surface quality and properties of the relief image printing element are important attributes for printing. Prolonged exposure time may be necessary in order to hold or fully cure smaller features such as highlight dots, including 1% to 5% dots (where % refers to the amount of paper covered with print ink during the printing process) to produce high quality print images. However, this overexposure has a tendency to fill in the reverse lines or shadow areas, which can result in image quality degradation.

The term "exposure latitude" or "image latitude" refers to the degree to which the printing element can be overexposed with only negligible image quality degradation. Exposure latitude can also be defined as the ability to simultaneously image low light throughput features, such as 1-2% dots and high light throughput features, such as 4-mil reverse lines, onto a flexographic relief image printing element. Relief image printing elements with larger exposure latitude are desirable as they are more tolerant to the actual exposure time used during imagewise exposure.

Thick, corrugated, liquid plate production has always had problems holding open fine reverses simultaneously with fine positive copy. In addition, some polymer formulations that exhibit reduced plate tack, have a tendency to give up a bit of image latitude in order to achieve the tack goal.

Various methods have been suggested for improving image latitude. For example, one method for improving image latitude includes the use of a high quality silver image film. Another option has been to use a thin gauge, ultra-clear oriented polypropylene (OPP) cover film to maintain reverse fidelity and image latitude by reducing light scatter. However, even when using both of these methods together, the results have still been limited. In addition, many corrugated customers prefer a matte finished film in order to create a texture surface on the plate for better ink transfer. Furthermore, 70 gauge OPP films are notorious for their problems with flatness and gauge bands that have a tendency to slow and frustrate platemaking during production. It can also be difficult to source a consistent supply of both silver films and ultra-high quality coverfilms. Thus, even when used together with the best liquid photopolymers, the image quality of uncapped plates can be poor.

The use of the best liquid photopolymer materials together with high quality cap resins can produce wide image latitude in a printing element. The capping process, however, is notorious for its complexity, especially if a customer has not invested in a separate capping manifold. Capped plates may also create coverage issues in solid areas. In some cases, other printing defects have also been reported, including dirty print and picking.

Liquid photopolymer resins formulated for corrugated platemaking are most commonly designed to make thick (e.g., at least about 0.250 in.) plates quickly, since this is the majority of the market. This type of plate is typically referred to as a "fast" product because it will build up floor thickness quickly but with limited uniformity. For a time, many customers used liquid photopolymer resins only for thick plates with simple copy and these fast photopolymers worked well. Increasingly though, due to the inherent lower cost of liquid island plates, customers have desired to make a wider range of copy in liquid. Customers have also desired to make thinner plates as well. However, the combination of thin plates and more challenging copy requires either a second, thin plate formulation, or a series of other measure that can attempt to make a fast formulation capable of extending its copy range.

Another issue in making thinner printing plates from liquid photopolymers concerns the need to control floor build up so that it is even across the entire image area. Only with tight floor control, can fine positive copy be held without over exposure of fine reverses.

In recent years, inkjet printing has become a viable option for making image film negatives for flexographic plate production. The standard procedure is to use only a UV opaque ink to block all image curing in the non-image area. The image area has no ink or coating applied at the time of image deposition. This methodology produces a reasonable replacement for silver film for low resolution corrugated copy that comprises mostly line images.

However, even with the most recent generations of inkjet printers, inks and substrates, it is difficult to produce image-worthy negative screen dots below 5% once screen rulings exceed 55 lines per inch. The problem is that small dots require extremely long exposures that tend to fill in reverses.

Various techniques have been utilized manually on a plate-by-plate basis to balance light in the exposure unit and produce image-worthy fine features. Many of these techniques have been performed with whatever materials are available at a given customer location in a somewhat haphazard fashion. The obvious problem with these approaches is that there is a great deal of variability and they are not easily repeatable.

One technique involves manually dyeing reverse areas with yellow or red dye to filter out some of the UV intensity and selectively reduce the reverse curing dosage and improve reverse fidelity. However, due to the complexity of this manual process, many customers have discontinued this practice. Additionally, while this hand application works for limited copy, it is very slow and requires considerable skill.

Another technique uses sheets of clear film which are cut into shapes and used as a filter. In other instances, filter tubes have been installed over at least a portion of the source of actinic radiation (e.g., fluorescent lamp). Additionally, reflective tape or polished metal reflectors have been installed in weak areas of the source of actinic radiation to increase intensity.

The inventors of the present invention have found that it is desirable to provide a more automated and reproducible approach for extending the copy range of liquid photopolymer printing elements that makes wide image production easier as well as more dependable. In addition, there remains a need in the art for an improved method that is reliable and efficient for preparing a relief printing plate from a photocurable printing plate precursor, and that can produce a relief printing plate with a relief structure that improves ink transfer to the substrate without negatively impacting dot gain and/or image resolution. It is also desirable to produce a relief image printing plate capable of printing a full tonal range, including printing of fine print elements and highlight dots and that provides improved print quality.

SUMMARY OF THE INVENTION

It is an object of the present invention to provide improvements to the liquid platemaking process.

It is another object of the present invention to extend the copy range of liquid photopolymer printing plates.

It is yet another object of the present invention to provide a higher quality thin plate made from a liquid photopolymer that has an extended copy range.

It is still another object of the present invention to make wide image production easier, more dependable and repeatable.

It is still another object of the present invention to provide an improved method of balancing light in a liquid platemaking process.

To that end, in one embodiment, the present invention relates generally to a method of creating an image film negative capable of masking non-image areas of one or more layers of liquid photopolymer during a step of imagewise exposing the one or more layers of liquid photopolymer to actinic radiation, the method comprising the steps of:
  a) providing an image film negative comprising a negative of an image on the image film negative, wherein the negative of the image comprises a pattern of opaque areas; and thereafter
  b) inkjet printing a filtering layer on portions of the image film negative not covered by the pattern of opaque areas, wherein the portions of the image film negative comprise portions where it is desirable to modulate intensity of actinic radiation in a subsequent exposure step.

In another embodiment, the present invention relates generally to a method of creating an image film negative capable of masking non-image areas of one or more layers of liquid photopolymer during a step of imagewise exposing the one or more layers of liquid photopolymer to actinic radiation, the method comprising the steps of:
  a) inkjet printing a negative of an image on an image film negative, wherein the negative of the image comprises a pattern of opaque areas; and
  b) inkjet printing a filtering layer on portions of the image film negative not covered by the pattern of opaque areas, wherein the portions of the image film negative comprise portions where it is desirable to modulate intensity of actinic radiation in a subsequent exposure step.

DETAILED DESCRIPTION OF THE PREFERRED EMBODIMENTS

"A," "an," and "the" as used herein refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +1-5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower" "above", "upper" and the like, are used for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly. It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

The present invention relates generally to a method of creating an image film negative capable of masking non-image areas of one or more layers of liquid photopolymer during a step of imagewise exposing the one or more layers of liquid photopolymer to actinic radiation.

In one embodiment, the method comprising the steps of:
a) providing an image film negative comprising a negative of an image on the image film negative, wherein the negative of the image comprises a pattern of opaque areas; and
b) inkjet printing a filtering layer on portions of the image film negative not covered by the pattern of opaque areas, wherein the portions of the image film negative comprise portions where it is desirable to modulate intensity of actinic radiation in a subsequent exposure step.

During the step of creating the image film negative that is used in the step of imagewise exposing at least one layer of liquid photopolymer, a UV filtering layer is added to the image film negative in the areas of the image that are subject to over-exposure during the long exposures required to hold the finest image copy, including small dots and fine lines, such as negative screen dots between about 1% and 5%.

The image film negative can be produced by various methods, including for example, traditional photographic methods, as well as computer controlled film exposure devices such as image setters (i.e., laser printers) and ink jet printers. For example, the negative of the image may be created by a method selected from the group consisting of using a laser to selectively remove UV opaque material coated onto a backing layer, direct printing, or by using an image setter to exposure a silver halide-coated plastic film.

The image film negative comprises a negative of an image that is used to mask non-image areas on the at least one layer of liquid photopolymer. The negative comprises opaque areas and transparent or translucent areas, and the relief is created where light passes through the transparent or translucent areas of the image film negative. In order to produce the relief, the photopolymer covered by the opaque areas of the image film negative must be completely shielded from the light.

In one embodiment, the image film negative is prepared using an inkjet printer. The negative portions of the image film negative are created by inkjet printing a suitably opaque inkjet ink onto portions of the image film negative using a plurality of inkjet print heads. At the same time, the UV filtering layer is applied using unused ink color heads (i.e., a second and different set of inkjet print heads) to apply the UV absorbing dye ink in various areas of the image film negative. One suitable inkjet printer is the MPS Quadra (available from as MacDermid Printing Solutions, LLC).

In creating the image film negative by inkjet printing, a UV-blocking ink is printed onto a clear substrate, which may be a polyester or other clear plastic material. In this instance, the surface of the substrate is inkjet-receptive or made to be inkjet-receptive, to enable the creation of a stable and detailed image that adheres to the plastic and dries quickly to produce a clear, sharp and well-defined image. The substrate may be made inkjet-receptive by coating it with an inkjet-receptive coating, e.g., a micro-porous coating or a coating of inkjet-receptive polymer, or the material may be treated in some other manner such as acid etching, etc. to produce a surface that allows the ink to adhere to the film and dry quickly. The uncoated substrate may alternatively be printed with an inkjet ink directly so long as the ink and the substrate are mutually compatible. The printed image must also have sufficient opacity (e.g., an opacity of at least about 3.0) to prevent UV curing of unexposed one or more layers of liquid photopolymer and any capping layers(s) during the time required to cure the exposed one or more layers of liquid photopolymer and any capping layer(s).

Thereafter, a UV absorbing dye ink is selectively applied to portions of film image carrier that are subject to over-exposure during the long exposures required to hold the finest image copy such as small dots and fine lines. The UV absorbing ink dye comprises a formulation that will absorb between about 10 to about 80% of the UV intensity of the source of actinic radiation, more preferably between about 20 to about 50% of the UV intensity of the source of actinic radiation. In one embodiment, the ink used to print the negative of the image on the image film negative is different from the ink used to print the filtering layer on the image film negative.

The UV absorbing dye ink is selectively applied to the solid areas of the printing surfaces having reverse and tone copy from mid tones to reverse tones. This can be selectively accomplished using suitable prepress software. Examples of suitable UV absorbing dyes for inclusion in the ink formulation include those dyes described, for example, in U.S. Pat. Pub. No. 2003/0219681 to Cheng et al., the subject matter of which is herein incorporated by reference in its entirety. In another embodiment, the image film negative is made using a colored opaque or transparent dye ink rather than the standard black used in the current generation of silver films or inkjet image films. It is also not necessary that the pattern of halftone dot created in the image film negative be completely opaque to UV light.

In another embodiment, the UV filtering layer may be applied to the image film negative in a separate step after the original image film negative has been created. In this embodiment, the UV filtering layer is added in a second step using a computer controlled deposition device such as an inkjet printer. Thus, the image film negative is first produced using various means known in the art, including, for example, image setting, laser printing, or inkjet printing. Once the image film negative has been created, the UV filtering layer is thereafter added to the image film or negative using the computer controlled deposition device to produce the filtered image film negative.

Either of these methods produces a filtered image film negative that is capable of modulating light intensity of the actinic radiation to improve the print quality of the resulting relief image printing element.

The method described herein puts the UV dye filtering under precise computer control, can be used on an extended range of copy, and is very repeatable. There is also no additional operator skill required beyond normal prepress computer work that is commonly part of flexographic printing plate production.

The process described herein can also be used to control light intensity of the one or more light sources used during both imagewise (i.e., face) exposure through the image film negative and during back exposure step used to create the floor layer in the at least one layer of liquid photopolymer. Furthermore, while the process is described herein in the context of liquid platemaking, the process is applicable to controlling light intensity in sheet photopolymer printing plate production as well.

The present invention provides an easy, repeatable means for balancing light in the photoexposure unit. Light balancing is an important issue for the back exposure of liquid photopolymer plates in order to produce a consistent floor layer across the entirety of the plate. In addition, it is also important for face exposure of liquid photopolymer plates and in both imagewise and back exposures in sheet photopolymer platemaking processes.

The primary requirement of light balancing is to even out light intensity from individual sources of light and to remove the typical higher intensity found in the center of a fluorescent bank lamp light system or any repeatable pattern from other light sources such as point arc lamps or newer LED lighting designs.

As described herein, the portions where it is desirable to modulate intensity of actinic radiation comprise portions that are subject to over-exposure during long exposures required to hold small dots and fine lines. In addition or, in the alternative, the portions where it is desirable to modulate intensity of actinic radiation comprise areas of higher overall light intensity found in a center of a bank light system or a repeatable pattern from one or more light sources, wherein overall light from the source of actinic radiation is balanced. Thus, the present invention can be used in connection with an image film negative to modulate light to improve exposure latitude by filtering certain transparent or translucent portions of the image film negative to allow fine positive copy to be held with over exposure of fine reverses. In addition, the present invention can be used to balance light from one or more sources of actinic radiation used to imagewise exposure the one or more layers of photopolymer to actinic radiation or in a back exposure step to provide tight floor control.

In addition, the present invention can also be used in the production of thin relief image printing elements produced from capped and uncapped liquid photopolymers by lowering the overall intensity of individual sources of light at the same time so that exposure times can be increased to allow for the floor to be built up in a slower, more controlled, manner.

The method described herein can be tuned for any given machine design and then refined for a particular situation. Once the filter file is created, it can be output at any time and it will perform precisely the same as the original. The film prepress process and output devices have proven to be highly repeatable.

The computer controlled deposition device (i.e., inkjet printer) is configured to include the necessary software for the production of the filtered image film negative. In addition, when multiple color printing is involved, there will typically be four filtered image film negatives, each representing a color separation. In the instance where the image film negative is itself produced by a computer controlled deposition process, the computer controls the computer controlled deposition device and creates halftone dots by exposing (or not exposing) individual pixels of a tile representing the unit area in which a dot is created. A combination of a plurality of pixels is used to form dots of different areas. Thereafter, the computer controlled deposition device produces the filtered portion on the image film negative to produce the filtered image film negative.

In the instance of using the process described herein for modulating light intensity during the back exposure step to produce the floor layer in a controlled manner, the backing layer that is placed over the one or more layers of liquid photopolymer is filtered. Thus, using the process described herein, an inkjet printer is used to print a filtering layer on the backing layer to create a filtered backing layer. This filtering layer may comprise, for example, a pattern of vignettes that have a higher screen percentage towards the center of each source of actinic radiation used in the back exposure step (i.e., each of the plurality of upper lights) and that each transition to a lower intensity away from the center of each source of actinic radiation. In this manner, the intensity of the light from each source of actinic radiation can be controlled to both lower the overall intensity of each of the individual sources of light and to also allow for consistent intensity of actinic radiation across the entirety of the one or more layers of liquid photopolymer being cross-linked and cured.

The present invention uses the halftone percentage to reduce the highest intensity areas to match the lower intensity areas. Screen values in each area are adjusted to precisely balance the light in that area. Areas of higher intensity have larger positive screen values to remove more intensity. The tone values then drop in relation to the intensity until the tone values reach zero, or near zero, as they reach the edges, corners or other areas of minimum intensity.

In one embodiment, the inventors of the present invention have found that the use of a Quadra ink jet film setter and an Esko thermal imager with Laser Point film can provide a good result. A filter image was designed with a higher positive halftone screen percentage toward the center of the lamps (i.e., source of actinic radiation) to reduce the center intensity and create a vignette to transition to the lower intensities found at the edges and corners.

Once the image film negative has been prepared in any of the manners described herein, a liquid photopolymer printing plate can be created in an exposure unit having a horizontal bottom glass with a source of UV light below it (lower light), and a lid having a flat top glass with a source of UV light above it (upper light).

The image film negative is placed on the bottom glass and is protected by a thin optically clear cover film. One or more layers of liquid photopolymer are then cast over the cover film to a predetermined thickness. A backing layer for supporting the photopolymer is then laminated over the liquid photopolymer. Thus a sandwich of negative, cover film, liquid photopolymer and backing layer is created.

The backing layer may comprise a sheet of photo-transmissive polymer such as polyester, with a "tie-coat" applied to one side to bond the cured photopolymer to the backing sheet. The backing layer is placed in such a manner that the tie-coat is in direct contact with the liquid photopolymer. Liquid photopolymers are cast over the image film negative (protected by a cover film) and bond to the polyester backing layer by the tie-coat. In the case of a capped plate, the liquid photopolymer is cast over a solid photopolymer cap which is disposed on the cover film. In the alternative, the use of the solid photopolymer cap alleviates the need for the coverfilm layer and the solid photopolymer layer is disposed directly on the negative and at least one layer of liquid photopolymer is cast thereon.

In addition, while thick printing elements (whether capped or uncapped) have a thickness of at least about 0.20 inches, more preferably at least about 0.25 inches, thin printing elements may have a thickness of less than about 0.15 inches, more preferably less than about 0.10 inches, and even less than about 0.075 inches.

The source of actinic radiation, i.e., UV light source in the lid (the upper light) is turned on for a prescribed amount of time to cause the photopolymer adjacent to the substrate to cross-link uniformly over the entire plate, forming the floor. The areas to be imaged are then exposed by the lower UV light source (from below the bottom glass) that shines through the clear areas of the relief image negative, which causes the photosensitive polymer to cross-link, forming images that bond to the polymer floor. The at least one layer of liquid photopolymer and any cap layer is cured by exposing the at least one layer of liquid photopolymer to actinic radiation to crosslink and cure the at least one layer of liquid photopolymer in areas not covered by the negative. The liquid photopolymer that is not exposed to UV light remains in a liquid state to be reclaimed and reused.

The actinic radiation typically contains a range of wavelengths capable of causing photopolymer materials to cure. The actinic radiation may be a source of ultraviolet (UV) or violet light, including, for example fluorescent bank lamp light systems, point arc lamps, or light emitting diodes operating at a particular wavelength.

Example

Tests were performed using the process described herein to make thin plates using the commercially available liquid photopolymer LTL (available from MacDermid Printing Solutions, LLC), which is designed for making thick plates with short exposure time for high productivity.

The results demonstrated that it is possible to make full tone range 85 line screen capped plates as thin as 0.090 inches thick. These plates were produced using the filtered film image carrier to lower the overall intensity and control the exposure and to dramatically improve the uniformity of the upper lamps.

Finally, it should also be understood that the following claims are intended to cover all of the generic and specific features of the invention described herein and all statements of the scope of the invention that as a matter of language might fall there between.

What is claimed is:

1. A method of creating an image film negative capable of masking non-image areas of one or more layers of liquid photopolymer during a step of imagewise exposing the one or more layers of liquid photopolymer to a source of actinic radiation, the method comprising the steps of:
   a) providing an image film negative comprising a negative of an image on the image film negative, wherein the negative of the image is printed with a first ink, and wherein the negative of the image comprises a pattern of opaque areas; and thereafter
   b) inkjet printing a filtering layer on portions of the image film negative not covered by the pattern of opaque areas, wherein the filtering layer is printed with a second ink, and wherein the portions of the image film negative comprise portions exposed to a modulated intensity of actinic radiation in an exposure step of imagewise exposing the one or more layers of liquid photopolymer to the source of actinic radiation.

2. The method according to claim 1, wherein the negative of the image is created by a method selected from the group consisting of using a laser to selectively remove UV opaque material coated onto a backing layer, direct printing, or by using an image setter to exposure a silver halide-coated plastic film.

3. The method according to claim 2, wherein the negative of the image is created by direct printing using a laser printer or an inkjet printer.

4. The method according to claim 1, further comprising the steps of:
   a) mounting the image film negative in a liquid photopolymer exposure unit;
   b) casting one or more layers of liquid photopolymer over the image film negative;
   c) placing a backing layer over the one or more layers of liquid photopolymer; and
   d) exposing the one or more layers of liquid photopolymer to the source of actinic radiation through the image film negative to selectively crosslink and cure the one more layers of liquid photopolymer not covered by the opaque portions of the negative, wherein the filtering layer modulates intensity of the source of actinic radiation.

5. The method according to claim 4, further comprising the step of applying a solid cap over the image film negative prior to step b).

6. The method according to claim 4, further comprising the step of back exposing the one or more layers of liquid photopolymer through the backing layer to create a floor layer in the one or more layers of liquid photopolymer adjacent to the backing layer prior to step d).

7. The method according to claim 6, further comprising the step of inkjet printing a filtering layer on the backing layer to modulate intensity of the one or more sources of actinic radiation used in the back exposure step, whereby a consistent floor layer is created.

8. The method according to claim 1, wherein the second ink of the filtering layer is a UV absorbing dye ink, said UV absorbing dye ink comprising a formulation that is capable of absorbing between about 10 to about 80% of the UV light intensity of the source of actinic radiation in the exposure step after inkjet printing.

9. The method according to claim 1, wherein the one or more layers of liquid photopolymer have an overall thickness of less than about 0.15 inches.

10. The method according to claim 9, wherein the one or more layers of liquid photopolymer have an overall thickness of less than about 0.10 inches.

11. The method according to claim 10, wherein the one or more layers of liquid photopolymer have an overall thickness of less than about 0.075 inches.

12. The method according to claim 1, wherein the portions exposed to a modulated intensity of the source of actinic radiation comprise portions that include 1% to 5% dots and fine lines.

13. The method according to claim 12, wherein the source of actinic radiation comprises a plurality of individual light sources and the filtering layer modulates the intensity of the individual light sources to balance the overall light emitted by the plurality of individual light sources.

14. The method according to claim 1, wherein the source of actinic radiation comprises a plurality of individual light sources and the filtering layer modulates the intensity of the individual light sources to balance the overall light emitted by the plurality of individual light sources.

* * * * *